United States Patent
Hamada

(10) Patent No.: US 7,327,622 B2
(45) Date of Patent: Feb. 5, 2008

(54) SEMICONDUCTOR DEVICE

(75) Inventor: Masayuki Hamada, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/391,558

(22) Filed: Mar. 29, 2006

(65) Prior Publication Data

US 2006/0221669 A1 Oct. 5, 2006

(30) Foreign Application Priority Data

Mar. 29, 2005 (JP) .............................. 2005-096318

(51) Int. Cl.
*G11C 7/02* (2006.01)
(52) U.S. Cl. ...................... 365/210; 365/205; 365/149
(58) Field of Classification Search ................ 365/210, 365/205, 149
See application file for complete search history.

(56) References Cited

U.S. PATENT DOCUMENTS 4,879,682 A * 11/1989 Engles ................... 365/185.25
2001/0053106 A1 * 12/2001 Sadakata ............... 365/230.05

FOREIGN PATENT DOCUMENTS

JP  2004-265533  9/2004

* cited by examiner

*Primary Examiner*—Huan Hoang
(74) *Attorney, Agent, or Firm*—Young & Thompson

(57) ABSTRACT

A semiconductor device includes: a first sense amplifier; a first bit line coupled to the first sense amplifier; a second bit line disposed next to the first bit line and electrically coupled to a constant-voltage source; and a first reference cell, including: a first transistor having a source and a drain, one of which is coupled to the first bit line; a second transistor, having a source and a drain, one of which is coupled to the second bit line, and the other coupled to the other of the source and drain of the first transistor, which is not coupled to the bit line BL1a; and a capacitance C1 having electrodes, one of which is coupled to the other of the source and the drain of the first transistor, and the other of the source and the drain of Tr2.

15 Claims, 10 Drawing Sheets

SEMICONDUCTOR DEVICE

This application is based on Japanese patent application No. 2005-96,318, the content of which is incorporated hereinto by reference.

BACKGROUND

1. Technical Field

The present invention relates to a semiconductor device including a reference cell having a capacitance.

2. Related Art

When a read-out operation from a memory cell of a dynamic random access memory (DRAM) is conducted, the following processing is conducted. First of all, an electrical voltage of a bit line (data line) that is coupled to a target memory cell is set to a pre-charging voltage. Subsequently, a transistor of the memory cell is switched to "on". At this time, a capacitance in the bit line set at the pre-charging voltage is coupled to a capacitance in its memory cell, an electric potential in the bit line is increased or decreased, depending on which value of 1 or 0 the memory cell stores. This variation is amplified with a sense amplifier in reference to the pre-charging electrical voltage to detect data stored in the memory cell.

Conventionally, a half voltage (½Vcc) of a charging voltage (Vcc) is employed for the pre-charging voltage. In addition, reduced charging voltage is employed for reducing a power consumption of DRAM in recent years. Therefore, if an electric potential difference between a drain and a source of a transistor in a memory cell is only ½Vcc, such smaller electric potential difference causes an increased time required for reading data out from the memory cell and detecting the data that have been stored in the memory cell with a sense amplifier.

In order to solve such problem, investigations in developments of a ground pre-charging DRAM, which utilize a pre-charging voltage of a bit line for a ground, are proceeded (Japanese Patent Laid-Open No. 2004-265,533). Such type of DRAM employs a reference cell (dummy cell) pre-charged with ½Vcc, and the memory cell is coupled to one of a pair of bit lines coupled to the sense amplifier and a reference cell is coupled to the other thereof. After pre-charging the pair of the bit lines at a level of the ground potential, capacitances of the memory cell and the reference cell are coupled to the bit lines, respectively. Then, a potential difference between an output from the memory cell and an output from the reference cell is detected and amplified with a sense amplifier to obtain data of the memory cell.

As such, the potential difference between the drain and the source of the transistor in the memory cell can be increased by utilizing the ground potential for the pre-charging voltage, and therefore it is expected that the time required for reading data out from the memory cell and detecting the data that have been stored in the memory cell with a sense amplifier is reduced.

Since the reference cells are required for the ground pre-charging DRAM, it is necessary to have ideas for suppressing an increase in area of a semiconductor device by highly effectively arranging the reference cells. Further, a path for coupling the reference cell to a constant-voltage source is required for setting the capacitance of the reference cell at a predetermined voltage.

SUMMARY OF THE INVENTION

According to the present invention, there is provided a semiconductor device, including: a first bit line; a second bit line disposed to be next to the first bit line; and a first reference cell, including: a first transistor having a source and a drain, one of the source and the drain being coupled to the first bit line; a second transistor having a source and a drain, one of the source and the drain being coupled to the second bit line, and the other being coupled to the other of the source and the drain of the first transistor, which is not coupled to the first bit line; and a first capacitance having electrodes, one of the electrode being coupled to the other of the source and the drain of the first transistor, which is not coupled to the first bit line, and also being coupled to the other of the source and the drain of the second transistor, which is not coupled to second first bit line.

Such configuration provides an exemplary operation, in which, for example, the first capacitance is coupled to the constant-voltage source through one of the bit lines such that an electric charge is accumulated in the first capacitance. Then, the accumulated electric charge can be taken out through the other of the bit lines from the first capacitance at a predetermined timing. Since a writing and a read-out of an electric charge is carried out through the bit lines at such occasion, the first reference cells can be arranged with an improved arranging efficiency.

The semiconductor device according to the present invention may have a configuration, in which the semiconductor device further includes a first sense amplifier, and the first bit line is coupled to the first sense amplifier, and the second bit line is electrically coupled to a constant-voltage source.

Such configuration provides an exemplary operation, in which, a predetermined electric charge is accumulated in the first reference cell by utilizing the second bit line, and an electric charge is taken out from the reference cell by utilizing the first bit line to output the obtained electric charge to the sense amplifier.

The semiconductor device according to the present invention may have a configuration, in which the semiconductor device further includes a third bit line coupled to said first sense amplifier and a memory cell coupled to the third bit line. The semiconductor device according to the present invention may include a dynamic random access memory (DRAM), and may be configured that the first bit line, the second bit line, the first reference cell and the third bit line are included in the DRAM structure. Here, the DRAM structure may be configured to have regular portions in most of the regions thereof, which include bit lines and word lines that are regularly and repeatedly arranged to form a pattern, and irregular portions in some regions. The first reference cell of the present invention may be disposed in such irregular portions.

Further, in the semiconductor device of the present invention, the DRAM may be a ground pre-charging DRAM, which utilizes a ground potential for a pre-charging voltage of the bit line when a read-out operation from the memory cell is conducted. In the semiconductor device of the present invention, the constant-voltage source may be configured to supply an electric voltage of ½Vcc (Vcc is a source voltage).

A semiconductor device of the present invention may be configured to have a plurality of device-forming regions that are isolated from other regions with a device isolation film. Each of the device-forming regions may be configured to include three impurity diffusion regions and two gate electrodes provided therebetween. The semiconductor device of the present invention may be configured to have such device-forming regions that are regularly disposed. Here, the second impurity diffusion region may be configured that two impurity diffusion regions, which are disposed to be adjacent each other via device isolation films of two device-forming regions isolated with a device isolation film when a plurality of device-forming region is regularly disposed, are formed to be coupled without being isolated with the device isolation film. In other words, the second impurity diffusion region may be formed to be broader than the first impurity diffusion region and the third impurity diffusion region, respectively. According to the present invention, in the semiconductor device that is configured to have a plurality of device-forming regions that are regularly disposed, the reference cells can be arranged with higher arranging efficiency by only having a configuration of coupling some device-forming regions thereto.

As described above, according to the present invention, the reference cells including capacitances can be arranged with an improved arranging efficiency.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures identical numeral is assigned to an element commonly appeared in the figures, and the detailed description thereof will not be presented. In the present embodiment, the semiconductor device is a DRAM. In the present embodiment, the DRAM is a ground pre-charging DRAM, which utilizes a ground potential for a pre-charging voltage of the bit line when a read-out operation from the memory cell is conducted.

Figure 1:
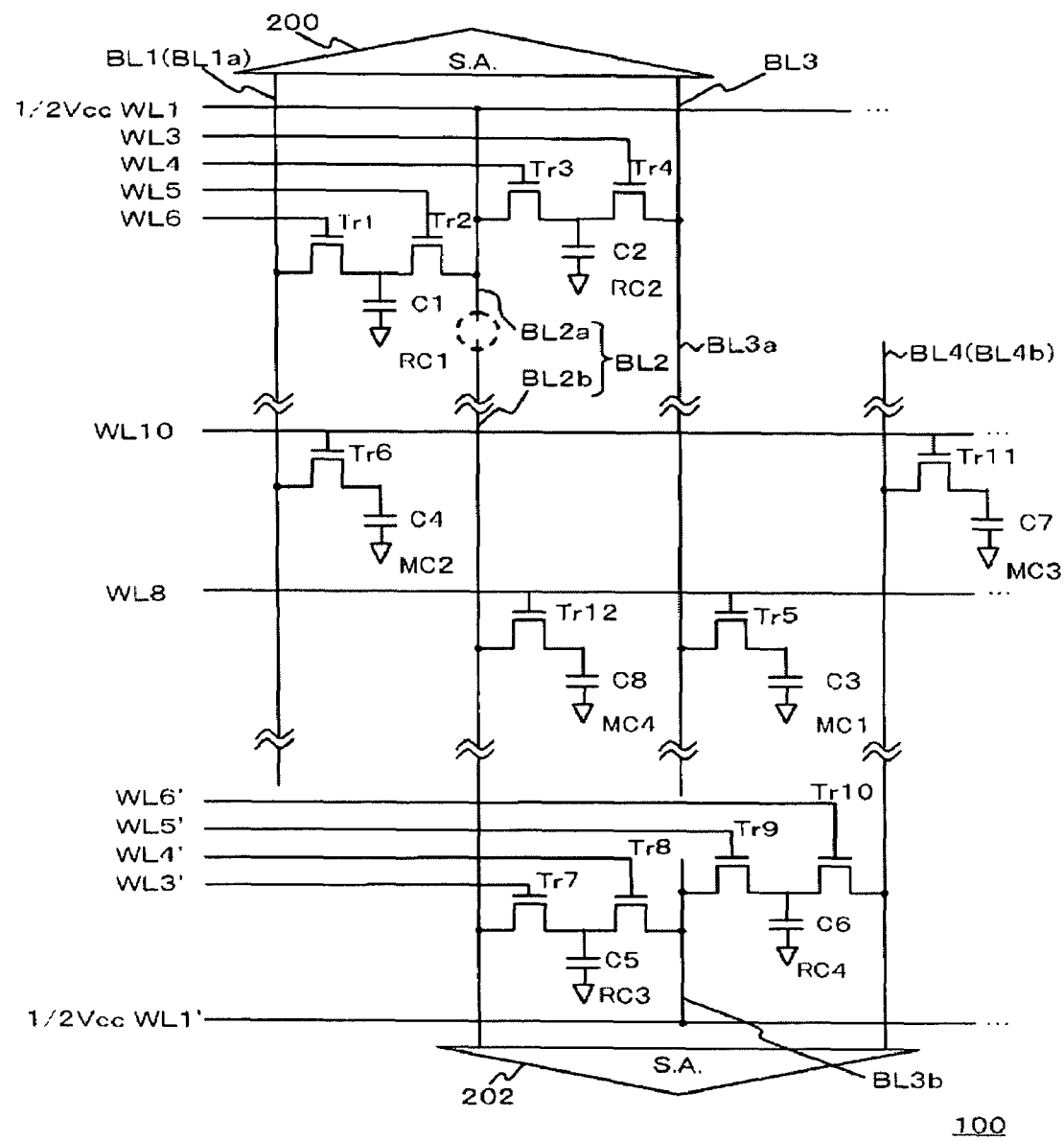
FIG. 1 is a circuit schematic, illustrating a configuration of a semiconductor device in an embodiment according to the present invention.

FIG. 1 is a circuit schematic, illustrating a configuration of a semiconductor device according to the present embodiment.

A semiconductor device 100 includes: a first sense amplifier 200; a bit line BL1 (first bit line) coupled to the first sense amplifier 200; a bit line BL2 (second bit line), which is disposed to be next to the bit line BL1 and is electrically coupled to a constant-voltage source; and a first reference cell RC 1. The first reference cell RC 1 includes: a transistor Tr1 (first transistor) having a source and a drain, one of which is coupled to the bit line BL1; a transistor Tr2 (second transistor), having a source and a drain, one of which is coupled to the second bit line BL2, and the other thereof is coupled to the other of the source and the drain of the transistor Tr1, which is not coupled to the bit line BL1; and a capacitance C1 (first capacitance) having electrodes, one of which is coupled to the other of the source and the drain of the transistor Tr1, which is not coupled to the bit line BL1, and the other of the source and the drain of Tr2, which is not coupled to the bit line BL2.

The semiconductor device 100 includes a plurality of bit lines including the bit line BL1, the bit line BL2, a bit line BL3 and a bit line BL4, which are shown to elongate in a longitudinal direction in the figure. In the present embodiment, each of the bit lines BL1 to BL4 have structures of being fragmented. For example, the bit line BL2 is composed of a bit line BL2a and a bit line BL2b. Similarly, for example, the bit line BL3 is composed of a bit line BL3a and a bit line BL3b. A first bit line group is composed of the bit line BL1a, the bit line BL2a and the bit line BL3a, each of which is shown in the figure to be arranged in the upper side of the broken portion of each of the bit lines BL1 to BL3, respectively. In addition, a second bit line group is composed of the bit line BL2b, the bit line BL3b and the bit line BL4b, each of which is shown in the figure to be arranged in the lower side of the broken portion of each of the bit lines BL2 to BL4.

The semiconductor device 100 includes a plurality of word lines, including a word line WL1, a word line WL3, a word line WL4, a word line WL5, a word line WL6, a word line WL8, a word line WL10, a word line WL6', a word line WL5', a word line WL4', a word line WL3' and a word line WL1', which are shown to elongate in a transverse direction in the figure. The plurality of word lines elongate along a direction that is substantially perpendicularity to the plurality of bit lines, and are provided to intersect with the plurality of bit lines.

The semiconductor device 100 includes a first memory cell MC1 coupled to the bit line BL3a, a second memory cell MC2 coupled to the bit line BL1a, a third memory cell MC3 coupled to the bit line BL4b and a fourth memory cell MC4 coupled to the bit line BL2b.

The first memory cell MC 1 includes: a transistor Tr5 having a source and a drain, one of which is coupled to the bit line BL3a, and a gate, which is coupled to the word line WL8; and a capacitance C3 having electrodes, one of which is coupled to the other of the source and the drain of the transistor Tr5, which is not coupled to the bit line BL3a. The second memory cell MC2 includes: a transistor Tr6 having a source and a drain, one of which is coupled to the bit line BL1a, and a gate, which is coupled to the word line WL10;

and a capacitance C4 having electrodes, one of which is coupled to the other of the source and the drain of the transistor Tr6, which is not coupled to the bit line BL1a. The third memory cell MC3 includes: a transistor Tr11 having a source and a drain, one of which is coupled to the bit line BL4a, and a gate, which is coupled to the word line WL10; and a capacitance C7 having electrodes, one of which is coupled to the other of the source and the drain of the transistor Tr11, which is not coupled to the bit line BL4a. The fourth memory cell MC4 includes: a transistor Tr12 having a source and a drain, one of which is coupled to the bit line BL2a, and a gate, which is coupled to the word line WL8; and a capacitance C8 having electrodes, one of which is coupled to the other of the source and the drain of the transistor Tr12, which is not coupled to the bit line BL2a.

The semiconductor device 100 includes a first reference cell RC1, a second reference cell RC2, a third reference cell RC3 and a fourth reference cell RC4.

The first reference cell RC1 includes: a transistor Tr1 having a source and a drain, one of which is coupled to the bit line BL1a, and a gate, which is coupled to the word line WL6; a transistor Tr2 having a source and a drain, one of which is coupled to the bit line BL2a and the other thereof is coupled to the other of the source and the drain of transistor Tr1, which is not coupled to the bit line BL1a, and a gate, which is coupled to the word line WL5; and a capacitance C1 having electrodes, one of which is coupled to the other of the source and the drain of the transistor Tr1, which is not coupled to the bit line BL1a, and to the other of the source and the drain of the transistor Tr2, which is not coupled to the bit line BL2a.

The second reference cell RC 2 includes: a transistor Tr3 having a source and a drain, one of which is coupled to the bit line BL2a, and a gate, which is coupled to the word line WL4; a transistor Tr2 having a source and a drain, one of which is coupled to the bit line BL3a and the other thereof is coupled to the other of the source and the drain of transistor Tr3, which is not coupled to the bit line BL2a, and a gate, which is coupled to the word line WL3; and a capacitance C2 having electrodes, one of which is coupled to the other of the source and the drain of the transistor Tr3, which is not coupled to the bit line BL2a, and to the other of the source and the drain of the transistor Tr4, which is not coupled to the bit line BL3a.

The third reference cell RC3 includes: a transistor Tr7 having a source and a drain, one of which is coupled to the bit line BL2b, and a gate, which is coupled to the word line WL3'; a transistor Tr8 having a source and a drain, one of which is coupled to the bit line BL3b and the other thereof is coupled to the other of the source and the drain of transistor Tr7, which is not coupled to the bit line BL2b, and a gate, which is coupled to the word line WL4'; and a capacitance C5 having electrodes, one of which is coupled to the other of the source and the drain of the transistor Tr7, which is not coupled to the bit line BL2b, and to the other of the source and the drain of the transistor Tr8, which is not coupled to the bit line BL3b.

The fourth reference cell RC4 includes: a transistor Tr9 having a source and a drain, one of which is coupled to the bit line BL3b, and a gate, which is coupled to the word line WL5'; a transistor Tr10 having a source and a drain, one of which is coupled to the bit line BL4b and the other thereof is coupled to the other of the source and the drain of transistor Tr9, which is not coupled to the bit line BL3b, and a gate, which is coupled to the word line WL6'; and a capacitance C6 having electrodes, one of which is coupled to the other of the source and the drain of the transistor Tr9, which is not coupled to the bit line BL3b, and to the other of the source and the drain of the transistor Tr10, which is not coupled to the bit line BL4b.

The semiconductor device 100 further includes: a first sense amplifier 200 coupled to one ends of the bit line BL1a and the bit line BL3a, and a second sense amplifier 202 coupled to one ends of the bit line BL2b and the bit line BL4b.

Further, one end of the bit line BL2a is coupled to the word line WL1, and one end of the bit line BL3b is coupled to the word line WL1'. Although it is not shown here, the word line WL1 and the word line WL1' are electrically coupled to the constant-voltage source to function as a word line for providing the coupling to the constant-voltage source. In the present embodiment, the word line WL1 and the word line WL1' are coupled to a ½Vcc power supply.

Figure 2:
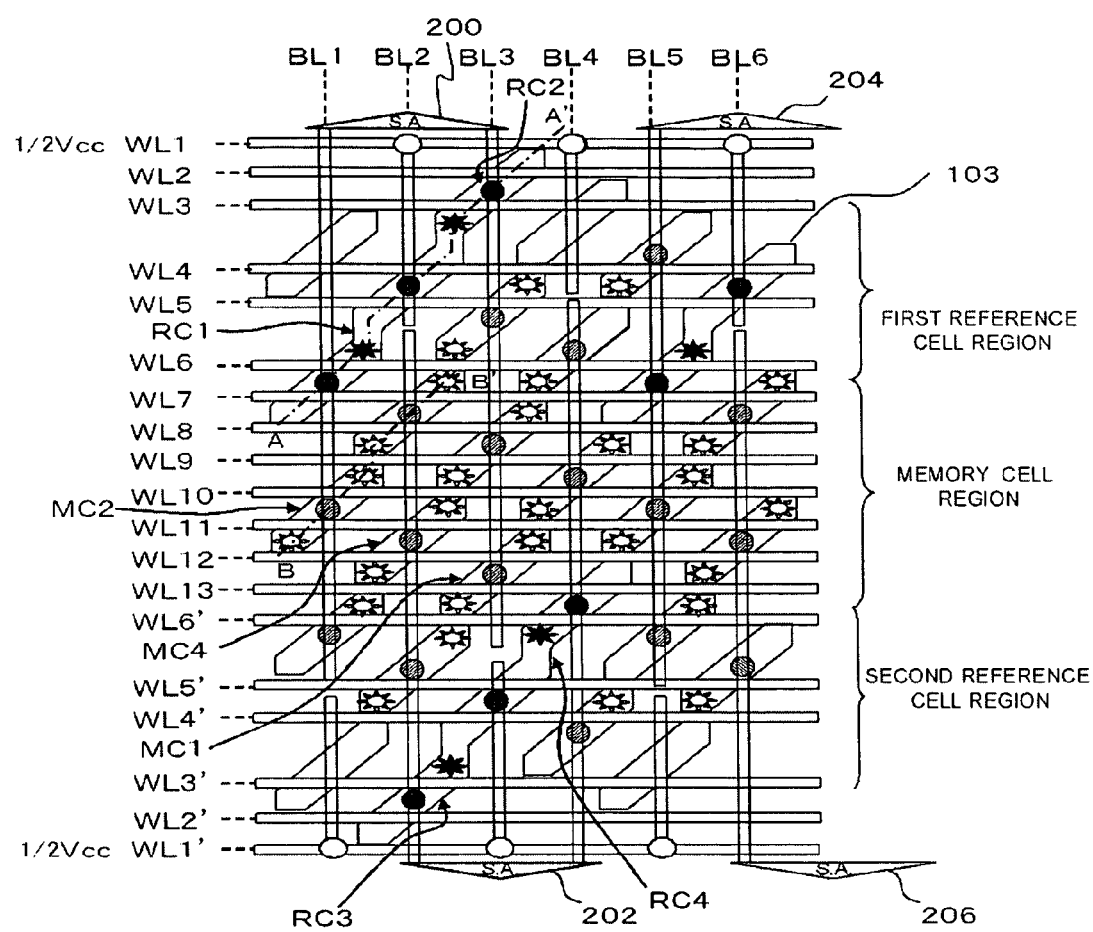
FIG. 2 is a plan view, illustrating the configuration of the semiconductor device in the embodiment according to the present invention.

FIG. 2 is a plan view, illustrating the configuration of the semiconductor device 100 according to the present embodiment.

The semiconductor device 100 further includes, in addition to the structure shown in FIG. 1, a plurality of bit lines (BL5 and BL6), a plurality of word lines (WL2, WL7, WL9, WL11, WL12, WL13 and WL2'), a third sense amplifier 204 and a fourth sense amplifier 206.

The semiconductor device 100 includes a memory cell region formed in a central portion thereof, and a first reference cell region and a second reference cell region, each formed in each side of the memory cell region. A first sense amplifier group composed of the first sense amplifier 200 and the third sense amplifier 204 is disposed in the end of the first reference cell region. In the first reference cell region, the bit line BL2a and alternately positioned bit lines from the bit line BL2a are coupled to the word line WL1, and eventually be electrically coupled to the constant-voltage source through the word line WL1. Further, pairs of bit lines, which are selected from the group consisting of the bit line BL1a and alternately positioned bit lines from the bit line BL1a, are coupled to one of the sense amplifiers in the first sense amplifier group, respectively.

Similarly, a second sense amplifier group composed of the second sense amplifier 202 and the fourth sense amplifier 206 is disposed in the end of the second reference cell region. In the second reference cell region, the bit line BL1b (or bit line BL3b) and alternately positioned bit lines from the bit line BL1b (or bit line BL3b) are coupled to the word line WL1, and eventually be electrically coupled to the constant-voltage source through word line WL1'. Further, pairs of bit lines, which are selected from the group consisting of the bit line BL2b and alternately positioned bit lines from the bit line BL2b, are coupled to one of the sense amplifiers in the second sense amplifier group, respectively. While the memory cell region is shown as being simplified for illustration, the semiconductor device 100 may further include a plurality of word lines and the memory cells other than that illustrated in the figures in the memory cell region.

Further, in the first bit line group, the bit line BL1a and alternately positioned bit lines from the bit line BL1a are formed to be longer than the bit line BL2a and alternately positioned bit lines from the bit line BL2a. In the second bit line group, the bit line BL2b and alternately positioned bit lines from the bit line BL2b are formed to be longer than the bit line BL3b and alternately positioned bit lines from the bit line BL3b.

The bit line BL1a and the alternately positioned bit lines from the bit line BL1a in the first bit line group have first regions, and the bit line BL2b and the alternately positioned bit lines from the bit line BL2b in the second bit line group have second regions. Where the first regions are arranged alternately with the second regions. The plurality of memory cells coupled to these bit lines are disposed among the first and the second regions.

Here, the word line WL2' and the word line WL2' are dummy or pseudo lines. Further, the bit lines BL4a, BL1b and BL5b or the like are not coupled to the memory cells or the reference cells, and thus do not contribute to the operation of the semiconductor device 100. Focusing the operability of the semiconductor device 100, the semiconductor device 100 might have a configuration that does not include the word line WL2 or WL2' or the bit line BL4a, BL1b or BL5b. However, a dimensional misalignment is more difficult to be generated as regularly and repeatedly arranging the pattern of the bit line and the word line as possible, when semiconductor device 100 is formed. Therefore, in the present embodiment, the semiconductor device 100 may be configured to include these dummy or pseudo word lines and bit lines. This allows forming the semiconductor device 100 with an improved accuracy. However, the bit lines BL4a, BL1b and BL5b are not necessary to be coupled to the word line WL1 or the word line WL1'. Further, the semiconductor device 100 may further include other pseudo bit lines and/or pseudo word lines, other than those illustrated here. By forming such pseudo bit lines and pseudo word lines, a pattern collapse of the effective bit lines and the effective word lines can be prevented, and therefore better performances of the semiconductor device 100 can be maintained.

In the present embodiment, the semiconductor device 100 includes a plurality of device-forming regions 103, which are isolated from other regions with a device isolation film (not shown in FIG. 2). Each of the device-forming regions 103 may be configured to include three impurity diffusion regions and two gate electrodes provided between the impurity diffusion regions. In the present embodiment, each of the device-forming regions 103 may be formed to be obliquely arranged over the word lines and the bit lines so as to be intersectional to two word lines and one bit line. In the present embodiment, in a reference cell-forming region, in which the first reference cell RC1 and the second reference cell RC2 are formed, the device-forming region 103 is configured to provide three device-forming regions 103, which are coupled in series, without being isolated with the device isolation film. Similarly, in another reference cell-forming region, in which the third reference cell RC3 and the fourth reference cell RC4 are formed, the device-forming region 103 is configured to provide three device-forming regions 103, which are coupled in series, without being isolated with the device isolation film.

Further, when a pattern of the word lines repeatedly regularly arranged, it is designed to dispose one word line between the word line WL3 and the word line WL4, between the word line WL5 and the word line WL6, between the word line WL6' and the word line WL5', and between the word line WL4' and the word line WL3', respectively. In the present embodiment, no word line is formed between the word line WL3 and the word line WL4, between the word line WL5 and the word line WL6, between the word line WL6' and the word line WL5', or between the word line WL4' and the word line WL3'. Having such configuration, it can be configured to have only one transistor formed between the contact that is coupled to the constant-voltage source and the capacitance in the reference cell, thereby maintaining higher current drive efficiency of transistor and providing highly effective accumulation of electric charge in the capacitance. More specifically, when a word line is regularly arranged between these word lines as conventional configurations, it should be configured that two transistors are coupled in series between the contact that is coupled to the constant-voltage source and the capacitance in the reference cell. Such configuration reduces the current drive efficiency of the transistor, so that it is impossible to conduct the accumulation of electric charge to the capacitance with an improved efficiency. According to the configuration of the semiconductor device 100 in the present embodiment, such problem can be solved.

Figure 3:
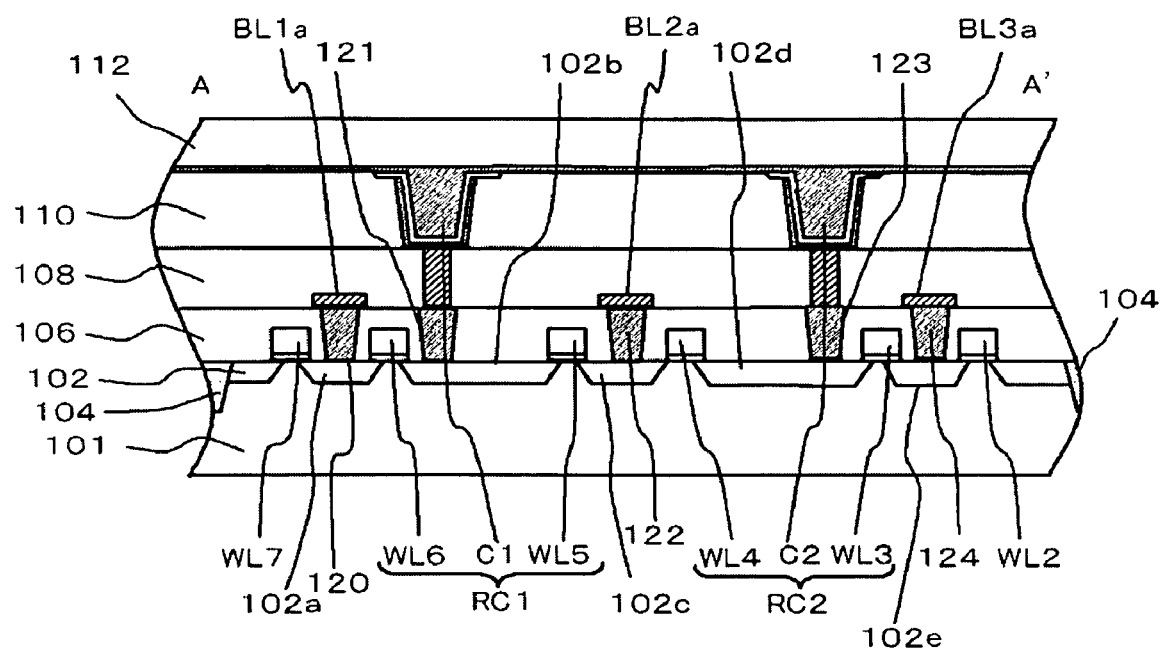
FIG. 3 is a cross-sectional view of the semiconductor device along line A-A' shown in FIG. 2.

FIG. 3 is a cross-sectional view of the device along line A-A' shown in FIG. 2. This illustrates configurations of the first reference cell region RC1 and the second reference cell RC2 of the semiconductor device 100. The semiconductor device 100 includes: an impurity diffusion region 102a (first impurity diffusion region); an impurity diffusion region 102b (second impurity diffusion region) disposed in an opposite side to the impurity diffusion region 102a in a relationship that the impurity diffusion region 102a and the impurity diffusion region 102b sandwiches a first gate region; an impurity diffusion region 102c (third impurity diffusion region) disposed in an opposite side to the impurity diffusion region 102b in a relationship that the impurity diffusion region 102b and the impurity diffusion region 102c sandwiches a second gate region; an impurity diffusion region 102d (fourth impurity diffusion region) disposed in an opposite side to the impurity diffusion region 102c in a relationship that the impurity diffusion region 102c and the impurity diffusion region 102d sandwiches a third gate region; and an impurity diffusion region 102e (fifth impurity diffusion region) disposed in an opposite side to the impurity diffusion region 102d in a relationship that the impurity diffusion region 102d and the impurity diffusion region 102e sandwiches a fourth gate region.

Further, the semiconductor device 100 includes: a first contact 120 provided in the impurity diffusion region 102a; a transistor Tr1 (first transistor) having a word line WL6 (first gate electrode) provided in the first gate region; a second contact 121 provided in the impurity diffusion region 102b; a capacitance C1 (first capacitance) having electrodes, one of which is coupled to the second contact 121; a transistor Tr2 (second transistor) having a word line WL5 (second gate electrode) provided in the second gate region; and a third contact 122 provided in the impurity diffusion region 102c. The transistor Tr1, the capacitance C1 and the transistor Tr2 compose the first reference cell RC1.

The semiconductor device 100 includes: a transistor Tr3 (third transistor) having a word line WL4 (third gate electrode) provided in the third gate region; a fourth contact 123 provided in the impurity diffusion region 102d; a capacitance C2 (second capacitance) having electrodes, in one of which is coupled to the fourth contact 123; a transistor Tr4 (fourth transistor) having a word line WL3 (fourth gate electrode) provided in the fourth gate region; and a fifth contact 124 provided in the impurity diffusion region 102e. The transistor Tr3, the capacitance C2 and the transistor Tr4 compose the first reference cell RC2.

Here, the impurity diffusion region 102b and the impurity diffusion region 102d are formed to be broader than the impurity diffusion region 102a, the impurity diffusion region 102c and the impurity diffusion region 102e. Further, a distance between the word line WL6 (first gate electrode) and the word line WL5 (second gate electrode) and a distance between the word line WL4 (third gate electrode) and the word line WL3 (fourth gate electrode) are formed to be longer than a distance between the word line WL5 and the word line WL4.

The semiconductor device 100 includes a semiconductor substrate 101, a plurality of impurity diffusion region 102 (including 102a to 102e) formed in the semiconductor substrate 101, and a device isolation film 104 that provides electrically isolations for a plurality of impurity diffusion regions 102 from other regions. The Semiconductor device 100 includes a first interlayer insulating film 106 formed on the semiconductor substrate 101, a second interlayer insulating film 108 formed thereon, a third interlayer insulating film 110 formed thereon and a fourth interlayer insulating film 112 formed thereon.

The first contact 120, the third contact 122 and the fifth contact 124 are coupled to the bit line BL1a, the bit line BL2a and the bit line BL3a, respectively. More specifically, when the word line WL5, for example, is maintained at higher voltage while a condition that electric charge is supplied to the bit line BL2a is maintained, electric charge is supplied into the capacitance C1 through the third contact 122, the impurity diffusion region 102c, the impurity diffusion region 102b and the second contact 121. Under such condition, when higher voltage is applied to the word line WL6, electric charge accumulated in the capacitance C1 is supplied to the bit line BL1a through the impurity diffusion region 102b, the impurity diffusion region 102a and the first contact 120 to be output to the first sense amplifier 200.

Figure 4:
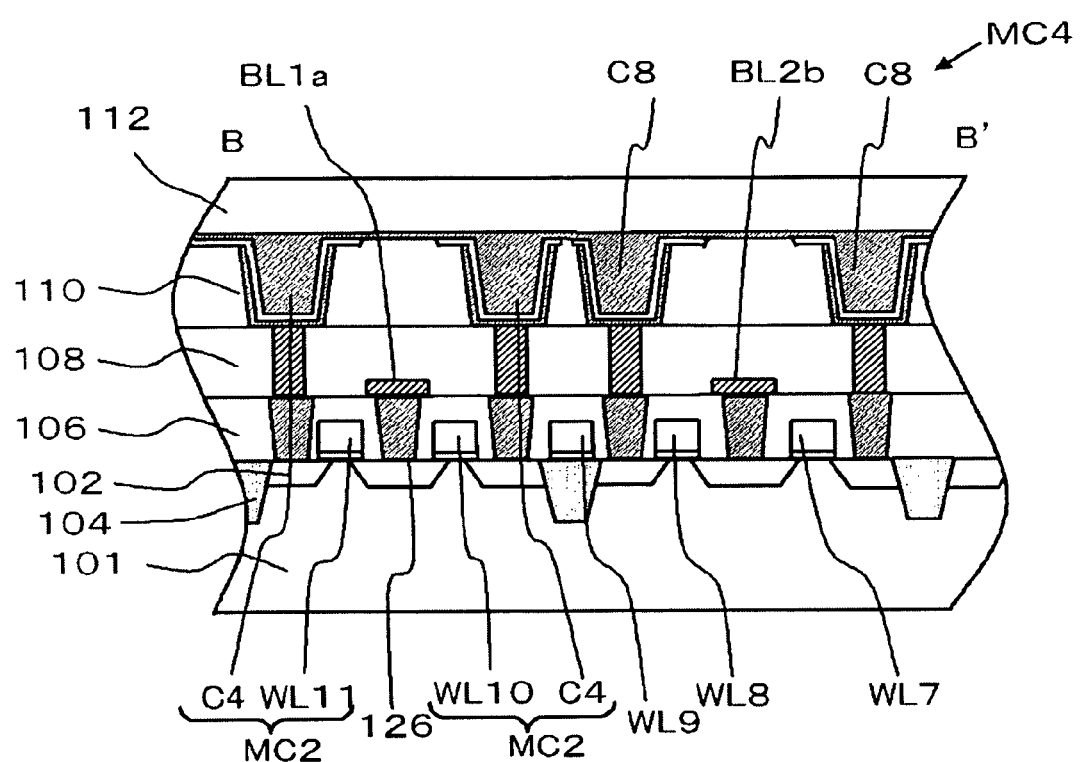
FIG. 4 is a cross-sectional view of the semiconductor device along line B-B' shown in FIG. 2.

FIG. 4 is a cross-sectional view of the device along line B-B' shown in FIG. 2. In this section, configurations of the second memory cell MC2 and the fourth memory cell MC4 of semiconductor device 100 will be illustrated. On the semiconductor device 101, a word line WL11, a word line WL10, a word line WL9, a word line WL8 and a word line WL7 are regularly disposed in this sequence. Contacts 126 are provided between the word lines, respectively. As shown in the figure, a contact 126 disposed in the left side of the word line WL11, a contact 126 disposed between the word line WL10 and the word line WL9, a contact 126 between the word line WL9 and the word line WL8 and a contact 126 disposed in the right side of the word line WL7 are coupled to each of the capacitances (C4 or C8), respectively. The contact 126 between the word line WL11 and the word line WL10 is coupled to the bit line BL1a, and the contact 126 between the word line WL8 and the word line WL7 is coupled to the bit line BL2b.

Further, in the semiconductor device 100, three impurity diffusion regions 102 are provided in the device-forming regions 103 surrounded by the device isolation film 104, respectively. A word line is provided in a gate region between the impurity diffusion regions 102, and the word line and the impurity diffusion region 102 disposed in each of the lateral sides thereof compose a transistor. Here, in this case shown in this figure, the word line WL9 is formed on the device isolation film 104, and does not function as the gate of the transistor. However, it is clear in reference to FIG. 2 that the word line WL9 functions as a gate of a transistor in other device-forming region 103. In the present embodiment, memory cells can be formed on the semiconductor device 101 with an improved arranging efficiency, by regularly arranging the impurity diffusion regions, the word lines, the contacts, the bit lines, the capacitances or the like.

Having such configuration described above, the memory cells and the reference cells can be arranged with an improved arranging efficiency in the semiconductor device having a configuration, which includes the bit lines, the word lines and the device-forming regions that are regularly and repeatedly arranged to form a pattern in most of the regions thereof. In particular, the bit lines, the word lines and the device-forming regions are utilized as electrical paths for coupling the reference cells with the constant-voltage source, so that the reference cell can be arranged without additionally providing new region. Further, since one bit line electrically coupled to the constant-voltage source is shared by two reference cells, more efficient arrangement can be achieved.

Next, operations of the semiconductor device 100 configured as described above will be described in reference to FIG. 1 to FIG. 4. This description will focus on data processing for reading out data from the first memory cell MC1. When data is read out from the first memory cell MC1, the first reference cell RC1 is employed as a reference cell, and based on output potential difference between an output from the first memory cell MC1 and an output from the first reference cell RC1, data in the form of "1" or "0" (a zero) stored in the capacitance C3 of the first memory cell MC1 are read out with the first sense amplifier 200.

Initially, electric potential of the bit line BL1a and the bit line BL3a is set to zero (GND). At this time, the bit line BL2a is coupled to a ½Vcc power supply, and therefore an electric potential of the bit line BL2a is ½Vcc.

Subsequently, an electric voltage is applied to the word line WL5, and the transistor Tr2 is turned "on". This allows accumulating an electric charge of ½Vcc into the capacitance C1. Then, an electric voltage is applied to the word line WL6 and the word line WL8. This allows turning the transistor Tr1 and the transistor Tr5 on, data stored in the capacitance C3 of the first memory cell MC1 and data stored in the capacitance C1 of the first reference cell RC1 are input into the first sense amplifier 200 through the bit line BL3a and the bit line BL1a, respectively. In the first sense amplifier 200, a potential difference between an output from the first memory cell MC1 and an output from the capacitance C1 of the first reference cell RC1 is detected, and is then amplified to detect data stored in the first memory cell MC1.

Similar processing is carried out that, when data is read out from the second memory cell MC2, the second reference cell RC2 is employed as a reference cell, and based on output potential difference between an output from the second memory cell MC2 and an output from the second reference cell RC2, data in the form of "1" or "0" (zero) stored in the capacitance C4 of the second memory cell MC2 are read out with the first sense amplifier 200.

Similarly, when data is read out from the third memory cell MC3, the third reference cell RC3 is employed as a reference cell, and based on output potential difference between an output from the third memory cell MC3 and an output from the third reference cell RC3, data in the form of "1" or "0" (zero) stored in the capacitance C7 of the third memory cell MC3 are read out with the second sense amplifier 202.

Similarly, when data is read out from the fourth memory cell MC4, the fourth reference cell RC4 is employed as a reference cell, and based on output potential difference between an output from the fourth memory cell MC4 and an output from the fourth reference cell RC4, data in the form of "1" or "0" (zero) stored in the capacitance C8 of the fourth memory cell MC4 are read out with the second sense amplifier 202.

Although only one memory cell is illustrated here for respective group, that is, each of the first memory cell MC1, the second memory cell MC2, the third memory cell MC3 and the fourth memory cell MC4 is only illustrated here, a plurality of memory cells respectively coupled to the bit line BL3a, the bit line BL1a, the bit line BL2b and the bit line BL4b may also be included in the semiconductor device 100. Data stored in the capacitance of the memory cells coupled to each of the bit lines can be read out with the similar procedure as described above, by suitably selecting the word line for applying an electric voltage.

According to the semiconductor device 100 in the present embodiment, the existing elements of the word lines, the bit lines and the impurity diffusion regions are utilized for providing electrical coupling to the reference cells and the constant-voltage source, such that the arrangement of the reference cells can be achieved without providing new region. Having such configuration, the ground pre-charging DRAM can be achieved with a simple configuration.

Next, a process for manufacturing the semiconductor device 100 in the present embodiment will be described. Hereinafter, descriptions will be made in reference to FIG. 5 to FIG. 10.

Figure 5:
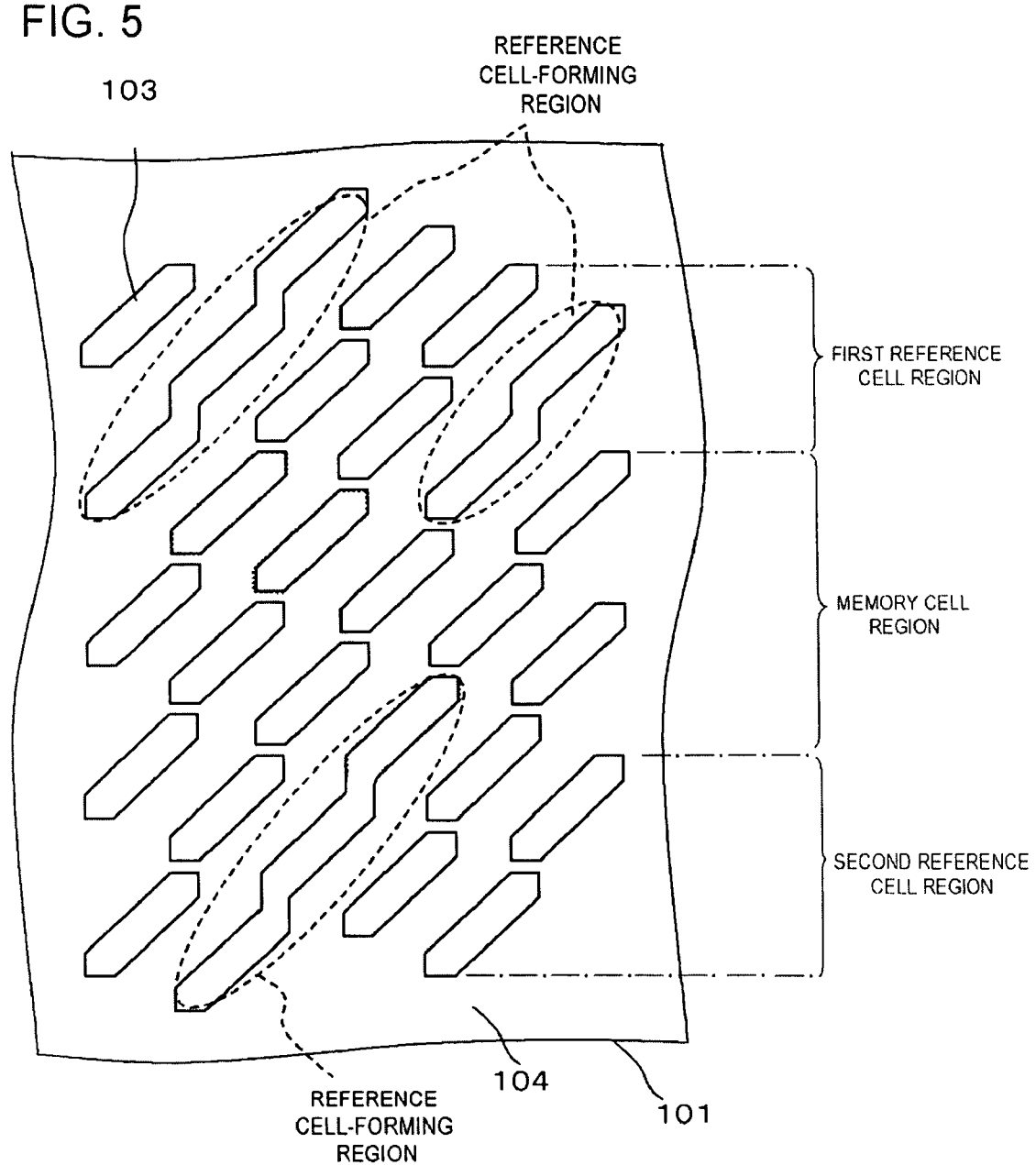
FIG. 5 is a schematic diagram, illustrating a procedure for manufacturing the semiconductor device in the embodiment according to the present invention.

First of all, a device isolation film 104 is formed in regions except the device-forming region 103 of the semiconductor substrate 101 that is silicon substrate, with a shallow trench isolation (STI) process (FIG. 5). In this case, the device-forming region is formed to be broader than other region in the reference cell-forming region formed at the first reference cell region or second reference cell region.

Figure 6:
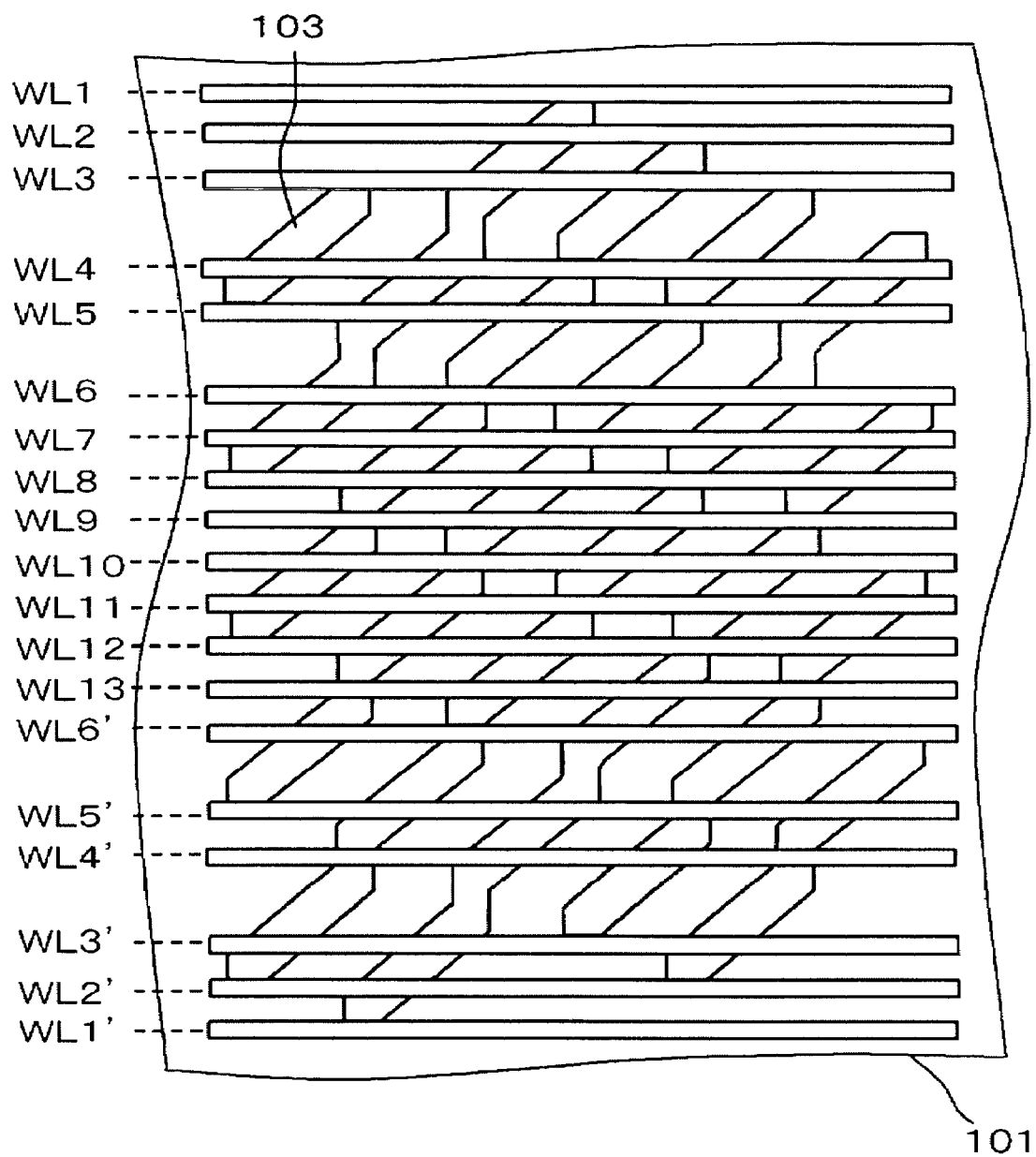
FIG. 6 is a schematic diagram, illustrating the procedure for manufacturing the semiconductor device in the embodiment according to the present invention.

Subsequently, a silicon oxide film is formed over the entire surface of the semiconductor substrate 101 via a thermal processing. Then, a polysilicon film is formed on the silicon oxide film via a chemical vapor deposition (CVD) process. Subsequently, the polysilicon film is patterned via a lithographic technology. Having this procedure, a plurality of word lines are formed (FIG. 6). In this case, in the first reference region, the spacing between the word line WL3 and the word line WL4 and the spacing between the word line WL5 and the word line WL6 are designed by presuming that a word line is formed between these word lines, respectively. However, the pattern is formed to exclude any bit line between the word line WL3 and the word line WL4 and between the word line WL5 and the word line WL6. Similarly, in the second reference region, the spacing between the word line WL3' and the word line WL4' and the spacing between the word line WL5' and the word line WL6' are designed by presuming that a word line is formed between these word lines, respectively. However, the pattern is formed to exclude any bit line between the word line WL3' and the word line WL4' and between the word line WL5' and the word line WL6'. Since the repetitive pattern of word lines may be altered by forming no word line in these regions, there is a fear that a dimension difference of the word lines may be caused. In the process for manufacturing the semiconductor device 100 in the present embodiment, an expected dimension difference is calculated in advance for the word lines in portions having no repetitive pattern, and patterning for forming the word lines may be conducted by employing the mask having a pattern having lines, widths of which are different from the width of the word lines in other portions, so as to compensate the dimension difference. This allows providing a prevention to the dimension difference of the word lines in the semiconductor device 100.

Figure 7:
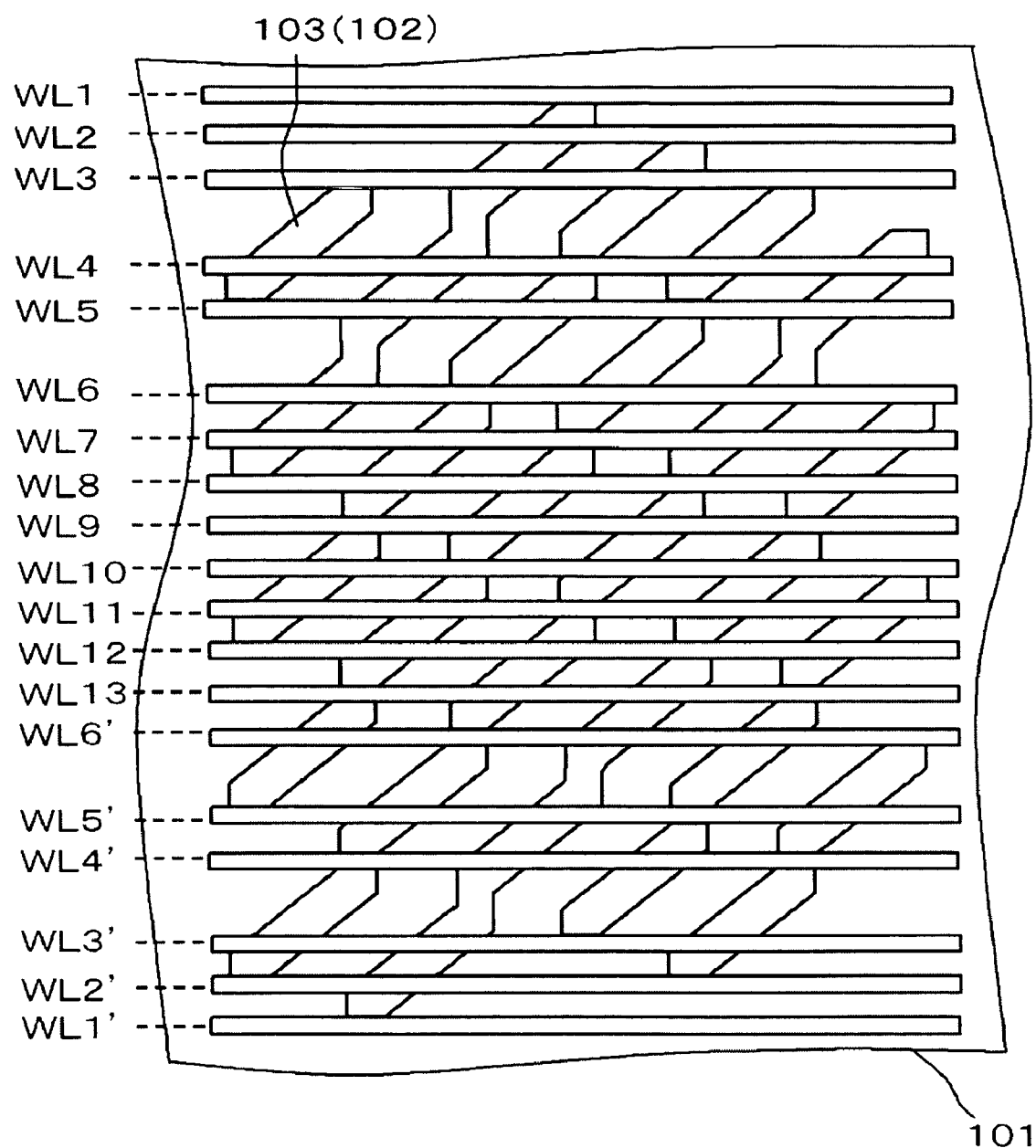
FIG. 7 is a schematic diagram, illustrating the procedure for manufacturing the semiconductor device in the embodiment according to the present invention.
Figure 8:
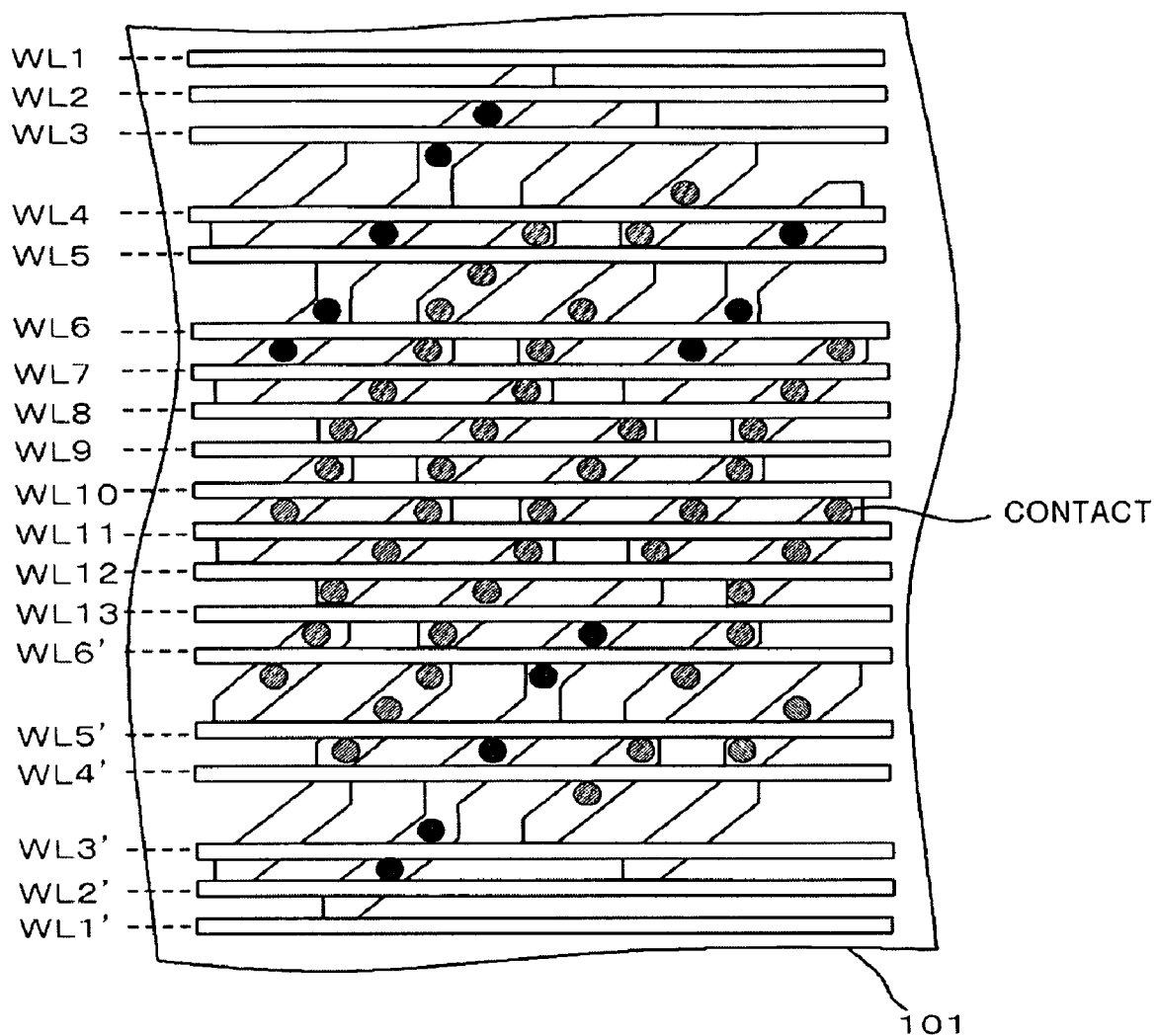
FIG. 8 is a schematic diagram, illustrating the procedure for manufacturing the semiconductor device in the embodiment according to the present invention.

Subsequently, an ion implantation process is conducted over the semiconductor substrate 101 through a mask of the word lines to form the impurity diffusion regions 102 (FIG. 7). Thereafter, a first interlayer insulating film 106 (see FIG. 3 and FIG. 4) is formed over the entire surface of the semiconductor substrate 101. In this case, before forming the first interlayer insulating film 106, an etch stop film may be formed over the entire surface of the semiconductor substrate 101. Then, the first interlayer insulating film 106 is selectively removed to form through holes that reach the impurity diffusion regions 102 of the semiconductor substrate 101. Subsequently, the through holes are plugged with a metallic material, and then, portions of the metallic material that is protruded from the through holes are removed via a chemical mechanical polishing (CMP). This process provides forming the contacts (FIG. 8).

Figure 9:
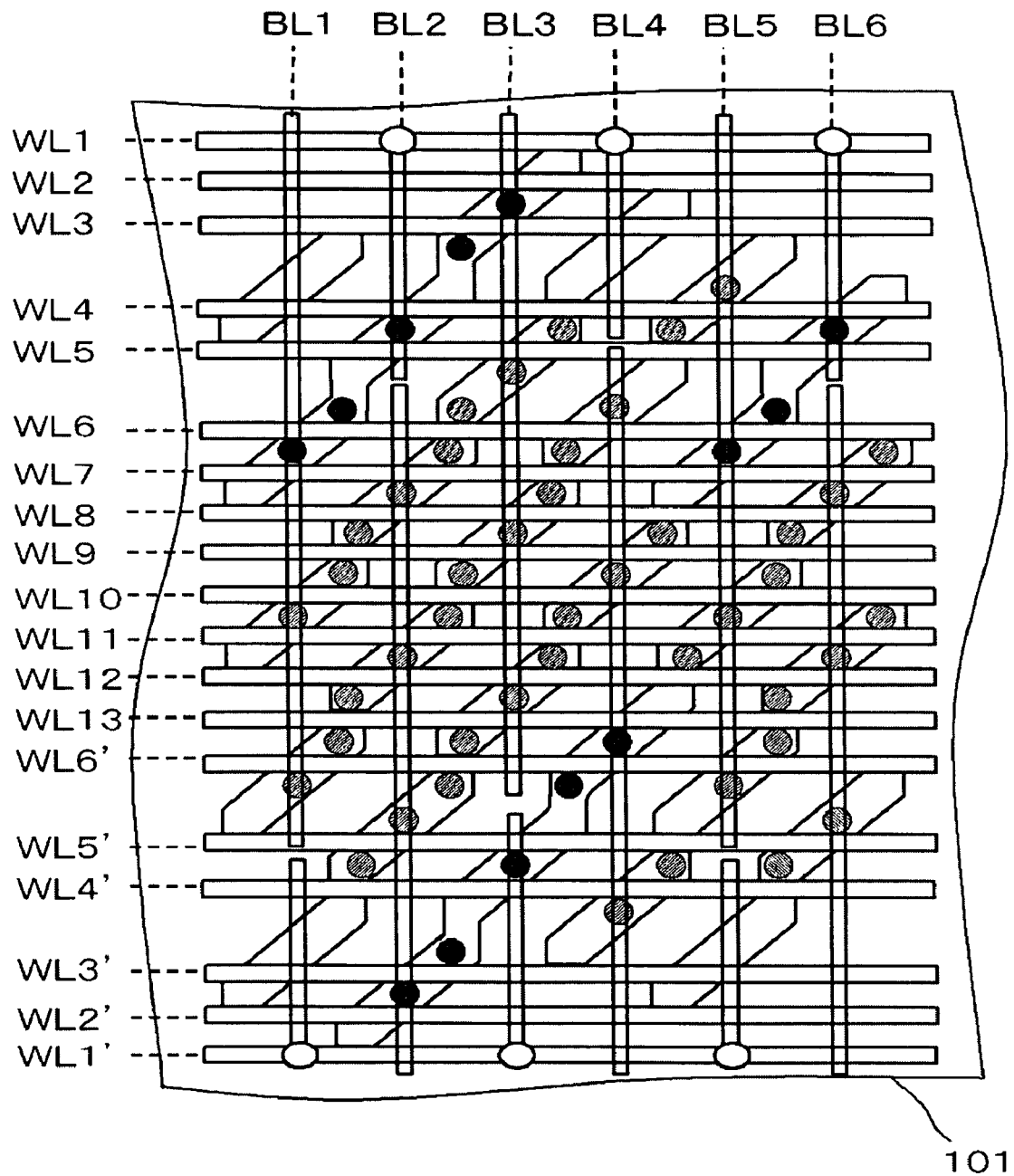
FIG. 9 is a schematic diagram, illustrating the procedure for manufacturing the semiconductor device in the embodiment according to the present invention.

Subsequently, a plurality of bit lines are formed on the corresponding contacts on the first interlayer insulating film 106 (FIG. 9). In this case, the bit line BL1, the bit line BL3 and the bit line BL5 are formed to include cutting portions in the side of the second reference cell region, which is shown in the lower side of the figure (see FIGS. 2 and 5). Further, the bit line BL2, the bit line BL4 and the bit line BL6 are formed to include cutting portions in the side of the first reference cell region, which is shown in the upper side of the figure (see FIGS. 2 and 5). This may provide a configuration of the device, in which a portion of the bit lines arranged along a straight line is utilized for providing an electrical coupling to the constant-voltage source, and the other portion is coupled to the sense amplifiers.

Figure 10:
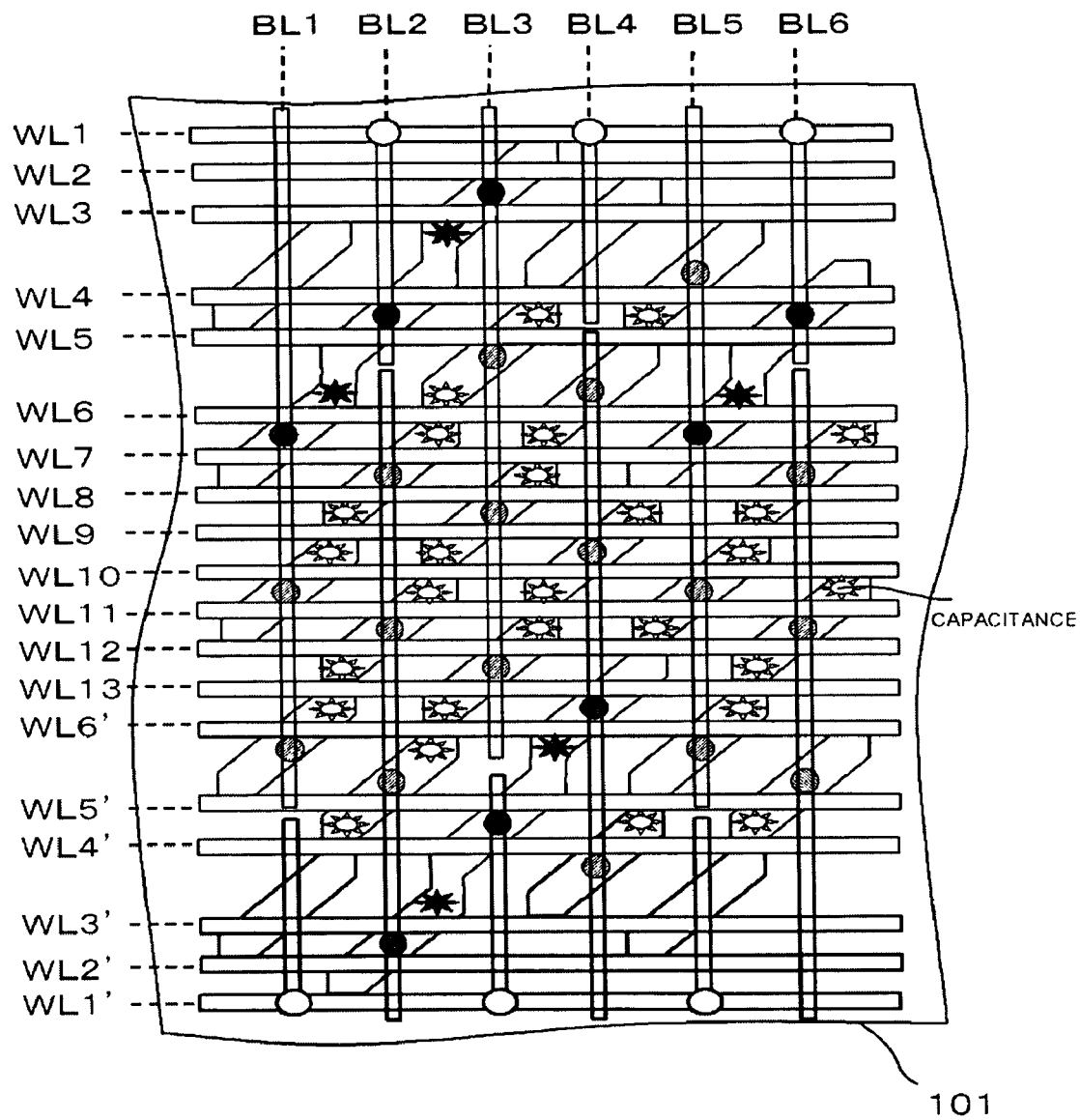
FIG. 10 is a schematic diagram, illustrating the procedure for manufacturing of the semiconductor device in the embodiment according to the present invention.

Then, a second interlayer insulating film 108 (see FIG. 3 and FIG. 4) is formed over the entire surface of the semiconductor substrate 101 on the first interlayer insulating film 106. Subsequently, the second interlayer insulating film 108 is selectively removed to form concave portions that reach predetermined contacts. Subsequently, the concave portions are plugged with a metallic material, and then, portions of the metallic material that are protruded from the concave portions is removed via the CMP. This provides plugs that are coupled to the contacts formed in the first interlayer insulating film 106. Thereafter, the third interlayer insulating film 110 (see FIG. 3 and FIG. 4) is formed on the second interlayer insulating film 108. Subsequently, the third interlayer insulating film 110 is selectively removed to form concave portions that reach the plug formed in the second interlayer insulating film 108. Then, a capacitance having a multiple-layered member comprising a lower electrode, a capacitive film and an upper electrode, which are stacked in this sequence on the entire surface of the semiconductor substrate 101, is formed (FIG. 10). Thereafter, the fourth interlayer insulating film 112 (see FIG. 3 and FIG. 4) is formed over the entire surface of the semiconductor substrate 101. This provides the semiconductor device 100 having the configuration shown in FIG. 3 and FIG. 4.

While the preferred embodiments of the present invention have been described above in reference to the annexed figures, it should be understood that the disclosures above are presented for the purpose of illustrating the present invention only, and various configurations other than the above described configurations can also be adopted.

While the descriptions have been made by illustrating the semiconductor device 100, which is typically a DRAM, as an exemplary implementation in the above-mentioned embodiments, the semiconductor device 100 may alternatively be configured to include a memory unit that is a DRAM and a logic unit. In the semiconductor device including the combination of the memory unit and the logic unit, it is often configured that a concentration of an impurity in the impurity diffusion region is set to be higher, for the purpose of reducing the resistance of the semiconductor device. Since the impurity diffusion region is utilized as the electric path for coupling thereof to the constant-voltage source in the semiconductor device of the present invention, it is preferable to exhibit lower resistance by establishing higher concentration of the impurity in the impurity diffusion region. Further, the semiconductor device of the present invention may alternatively be configured to have a silicide layer such as $CoSi_2$ layer and the like formed in the impurity diffusion region.

In addition, while the descriptions have been made by illustrating the configuration of the semiconductor device, in which two bit lines coupled to one sense amplifier are provided in parallel along the direction toward the sense amplifier, as an exemplary implementation in the above-mentioned embodiments, two bit lines coupled to one sense amplifier may alternatively extend along a direction that is not toward the bit line.

In addition, while the capacitance of the cylinder-type is illustrated as an exemplary implementation as shown in FIG. 3 and FIG. 4 in the above-mentioned embodiments, the available capacitance is not limited to such type, and various types thereof may also be employed.

In addition, the configuration having the bit lines disposed in the layer that lies under the capacitance is illustrated as shown in FIG. 3 and FIG. 4 in the above-mentioned embodiments, the available configuration thereof is not limited thereto, and a configuration having the bit lines disposed in the layer that lies above the capacitance may alternatively be employed.

It is apparent that the present invention is not limited to the above embodiment, and may be modified and changed without departing from the scope and spirit of the invention.

What is claimed is:

1. A semiconductor device, comprising:
   a first bit line;
   a second bit line disposed to be next to said first bit line; and
   a first reference cell, including:
   a first transistor having a source and a drain, one of said source and said drain being coupled to said first bit line;
   a second transistor having a source and a drain, one of said source and said drain being coupled to said second bit line, and the other being coupled to the other of said source and said drain of said first transistor, which is not coupled to said first bit line;
   a first capacitance having electrodes, one of said electrode being coupled to said other of said source and said drain of said first transistor, which is not coupled to said first bit line, and also being coupled to said other of said source and said drain of said second transistor, which is not coupled to second first bit line; and
   a first sense amplifier, wherein said first bit line is coupled to said first sense amplifier, and said second bit line is electrically coupled to a constant-voltage source.

2. The semiconductor device according to claim 1, further comprising:
   a third bit line disposed to be next to said second bit line at a side that is opposite to a side of said first bit line, said third bit line being coupled to said first sense amplifier; and
   a second reference cell including:
   a third transistor having a source and a drain, one of said source and said drain being coupled to said second bit line;
   a fourth transistor having a source and a drain, one of said source and said drain being coupled to said third bit line, and the other being coupled to the other of said source and said drain of said third transistor, which is not coupled to said second bit line; and
   a second capacitance having electrodes, one of said electrode being coupled to said other of said source and said drain of said third transistor, which is not coupled to said second bit line, and also being coupled to said other of said source and said drain of said fourth transistor, which is not coupled to said third bit line.

3. The semiconductor device according to claim 1, further comprising:
   a first bit line group including a plurality of bit lines provided in parallel, said plurality of bit lines including said first bit line and said second bit line; and
   a first sense amplifier group including a plurality of sense amplifiers which are disposed at one ends of said plurality of bit lines in said first bit line group, said plurality of sense amplifiers including said first sense amplifier,
   wherein, in said first bit line group, pairs of bit lines selected from said first bit line and bit lines alternately positioned from said first bit line, are coupled to one of said plurality of sense amplifier of said first sense amplifier group, respectively, at said one ends, said pairs of bit lines being selected such that one of said bit lines is disposed therebetween, and
   wherein each of said bit lines respectively disposed between said pair of bit lines, is electrically coupled to said constant-voltage source.

4. The semiconductor device according to claim 3, further comprising:
   a first word line for providing a coupling to the constant-voltage source, said first word line being provided at said one ends of said plurality of bit lines in said first bit line group, and being electrically coupled to said constant-voltage source,
   wherein each of said bit lines respectively disposed between said pair of bit lines, is coupled to said first word line for providing the coupling to the constant-voltage source at said one ends, and is electrically coupled to said constant-voltage source via said first word line for providing the coupling to the constant-voltage source.

5. The semiconductor device according to claim 3, further comprising:
   a second bit line group, including a plurality of bit lines provided in co-linear with said plurality of bit lines in said first bit line group, said plurality of bit lines of said bit line group including a fourth bit line provided in co-linear with said second bit line in said first bit line group, and a fifth bit line provided to be next to said fourth bit line; and
   a second sense amplifier group including a plurality of sense amplifiers disposed at one ends of said plurality of bit lines in said second bit line group;
   wherein each of the other ends of said plurality of bit lines in said second bit line group is provided to be facing to the other ends of said plurality of bit lines in said first bit line group,
   wherein, in said second bit line group, pairs of bit lines selected from said fourth bit line and bit lines alternately positioned from said fourth bit line, are coupled to one of said plurality of sense amplifier of said second sense amplifier group, respectively, at said one ends, said pairs of bit lines being selected such that one of said bit lines is disposed therebetween, and
   wherein each of said bit lines respectively disposed between said pair of bit lines, is electrically coupled to said constant-voltage source.

6. The semiconductor device according to claim 5, further comprising:
   a second word line for providing a coupling to the constant voltage source, said second word line being provided at said one ends of said plurality of bit lines in said second bit line group, and being electrically coupled to said constant-voltage source, wherein, in said second bit line group, each of said bit lines respectively disposed between said pair of bit lines, is coupled to said second word line for providing the coupling to the constant-voltage source at said one ends, and is electrically coupled to said constant-voltage source via said second word line for providing the coupling to the constant voltage source.

7. The semiconductor device according to claim 5, wherein, in said first bit line group, said first bit line and bit lines alternately positioned from said first bit line are formed to be longer than said second bit line and bit lines alternately positioned from said second bit line, wherein, in said second bit line group, said fourth bit line and bit lines alternately positioned from said fourth bit line are formed to be longer than said fifth bit line and bit lines alternately positioned from said fifth bit line, and wherein said first bit line and bit lines alternately positioned from said first bit line in said first bit line group have first regions, and said fourth bit line and bit lines alternately positioned from said fourth bit line in said second bit line group have second regions, said first regions being arranged alternately with said second regions, and a plurality of memory cells each being coupled to one of said bit lines being disposed in said first and said second regions.

8. A semiconductor device, comprising:
a first bit line;
a second bit line disposed to be next to said first bit line; and
a first reference cell, including:
a first transistor having a source and a drain, one of said source and said drain being coupled to said first bit line;
a second transistor having a source and a drain, one of said source and said drain being coupled to said second bit line, and the other being coupled to the other of said source and said drain of said first transistor, which is not coupled to said first bit line;
a first capacitance having electrodes, one of said electrode being coupled to said other of said source and said drain of said first transistor, which is not coupled to said first bit line, and also being coupled to said other of said source and said drain of said second transistor, which is not coupled to second first bit line;
a first impurity diffusion region;
a second impurity diffusion region disposed in an opposite side to said first impurity diffusion region, said second impurity diffusion region and said first impurity diffusion region sandwiching a first gate region;
a third impurity diffusion region disposed in an opposite side to said second impurity diffusion region, said third impurity diffusion region and said second impurity diffusion region sandwiching a second gate region;
a first contact provided in said first impurity diffusion region, said first contact being coupled to said first bit line;
a second contact provided in said second impurity diffusion region, said second contact being coupled to said one of the electrode that is coupled to said first transistor; and
a third contact provided in said third impurity diffusion region, said third contact being coupled to said second bit line,
wherein a first gate electrode of said first transistor is provided in said first gate region, and a second gate electrode of said second transistor is provided in said second gate region.

9. The semiconductor device according to claim 8, wherein said second impurity diffusion region is formed to be broader than said first impurity diffusion region.

10. The semiconductor device according to claim 8, wherein said second impurity diffusion region is formed to be broader than said third impurity diffusion region.

11. The semiconductor device according to claim 8, further comprising:
a fourth impurity diffusion region disposed in an opposite side to said third impurity diffusion region, said fourth impurity diffusion region and said third impurity diffusion region sandwiching a third gate region;
a fifth impurity diffusion region disposed in an opposite side to said fourth impurity diffusion region, said fifth impurity diffusion region and said fourth impurity diffusion region sandwiching a fourth gate region;
a third transistor including a third gate electrode provided in said third gate region;
a fourth transistor including a fourth gate electrode provided in said fourth gate region;
a third bit line disposed in an opposed side to said first bit line to be next to said second bit line;
a fourth contact provided in said fourth impurity diffusion region;
a second capacitance having electrodes, one of said electrodes being coupled to said fourth contact; and
a fifth contact provided in said fifth impurity diffusion region, said fifth contact being coupled to said third bit line.

12. The semiconductor device according to claim 11, wherein said fourth impurity diffusion region is formed to be broader than said third impurity diffusion region.

13. The semiconductor device according to claim 11, wherein said fourth impurity diffusion region is formed to be broader than said fifth impurity diffusion region.

14. The semiconductor device according to claim 11, wherein a distance between said first gate electrode and said second gate electrode is larger than a distance between said second gate electrode and said third gate electrode.

15. The semiconductor device according to claim 11, wherein a distance between said third gate electrode and said fourth gate electrode is larger than a distance between said second gate electrode and said third gate electrode.

* * * * *